United States Patent [19]
Ohira et al.

[11] Patent Number: 6,098,539
[45] Date of Patent: Aug. 8, 2000

[54] APPARATUS FOR SCREEN POSITION CORRECTING IN SCREEN PRINTING

[75] Inventors: Hiroyuki Ohira, Chiba; Shinichi Araya; Koji Kudo, both of Akita, all of Japan

[73] Assignee: TDK Corporation, Japan

[21] Appl. No.: 09/076,406

[22] Filed: May 12, 1998

[30] Foreign Application Priority Data

May 12, 1997 [JP] Japan ................................ 9-135781

[51] Int. Cl.⁷ ................................................ B05C 17/06
[52] U.S. Cl. .................................. 101/127.1; 101/126
[58] Field of Search ................................ 101/114, 115, 101/123, 124, 126, 127.1, 129, DIG. 36, 481, 485, 486; 33/614, 617, 620, 621

[56] References Cited

U.S. PATENT DOCUMENTS

| | | | |
|---|---|---|---|
| 4,750,419 | 6/1988 | Meredith ................................ | 101/124 |
| 5,129,155 | 7/1992 | Hoffman et al. ..................... | 101/115 |
| 5,226,366 | 7/1993 | Schlife et al. ....................... | 101/485 |
| 5,619,919 | 4/1997 | Karlyn et al. ........................ | 101/123 |
| 5,671,672 | 9/1997 | Savva ................................... | 101/127.1 |

FOREIGN PATENT DOCUMENTS

| | | |
|---|---|---|
| 63-207646 | 8/1988 | Japan . |
| 5-229097 | 9/1993 | Japan . |
| 8-11284 | 1/1996 | Japan . |

*Primary Examiner*—Ren Yan
*Attorney, Agent, or Firm*—Lerner, David, Littenberg, Krumholz & Mentlik, LLP

[57] ABSTRACT

Methods and apparatus for adjusting the position of a printing screen having a center of rotation mounted on a screen frame for use in screen printing processes are disclosed. The apparatus includes a screen frame with a printing screen mounted thereon, a screen frame holder, a plurality of first arcuate guides mounted on the screen frame defining an arc with a predetermined circumference defined by a predetermined radius, a plurality of guide rollers mounted on the screen frame holder and corresponding to the plurality of first arcuate guides whereby the plurality of guide rollers movably supports the plurality of first arcuate guides and an adjustment mechanism adapted to urge the screen frame around the center of rotation of the printing screen.

8 Claims, 3 Drawing Sheets

1: Printing Screen,  2: Screen Frame,  11: Screen Frame Holder,
12: Guide Roller,  20: Adjustment Mechanism,  21: θ-axis Adjusting Screw,
30: Screen Frame Receiving Mechanism

[FIG. 1]
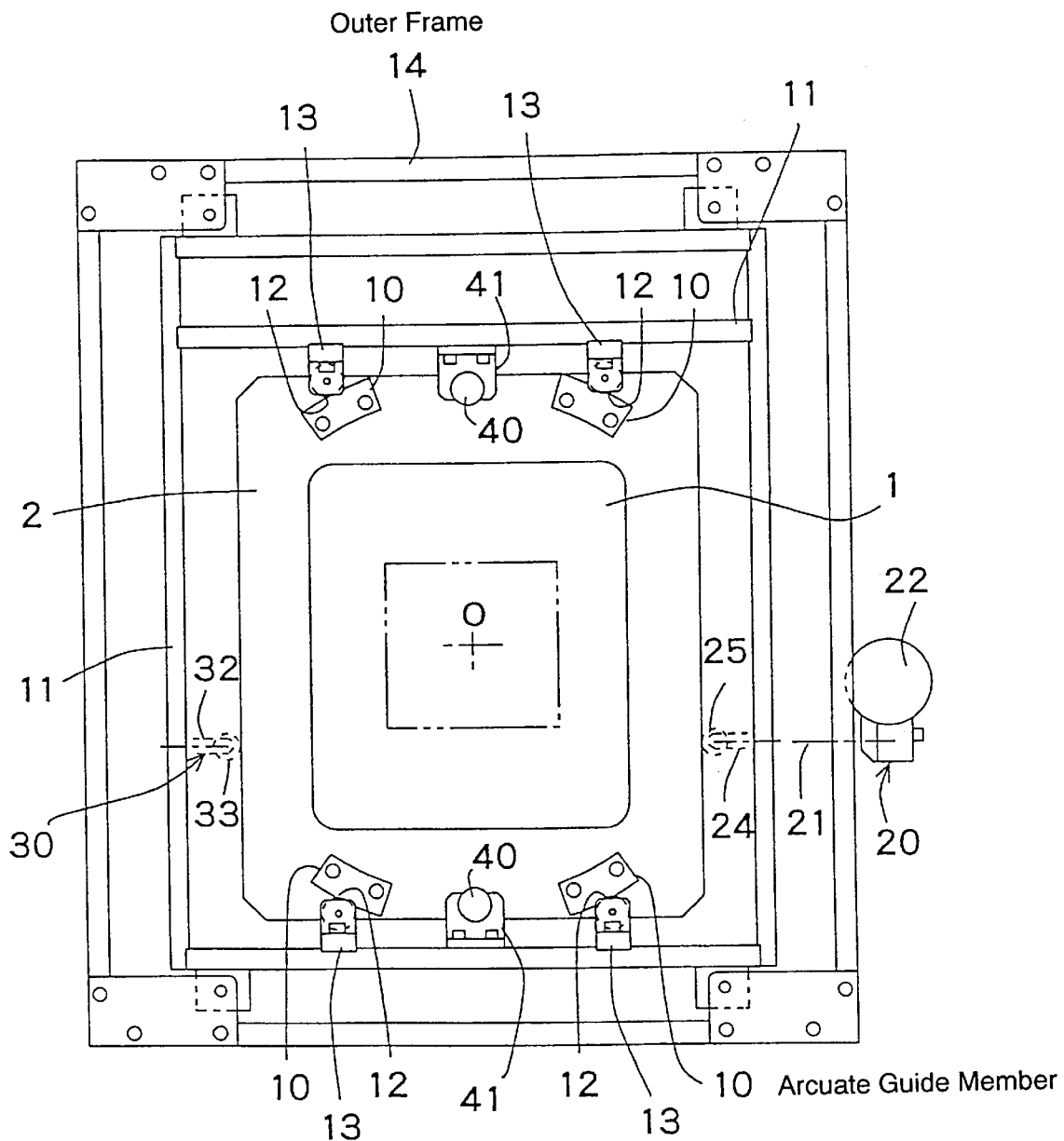
1: Printing Screen, 2: Screen Frame, 11: Screen Frame Holder,
12: Guide Roller, 20: Adjustment Mechanism, 21: θ-axis Adjusting Screw,
30: Screen Frame Receiving Mechanism

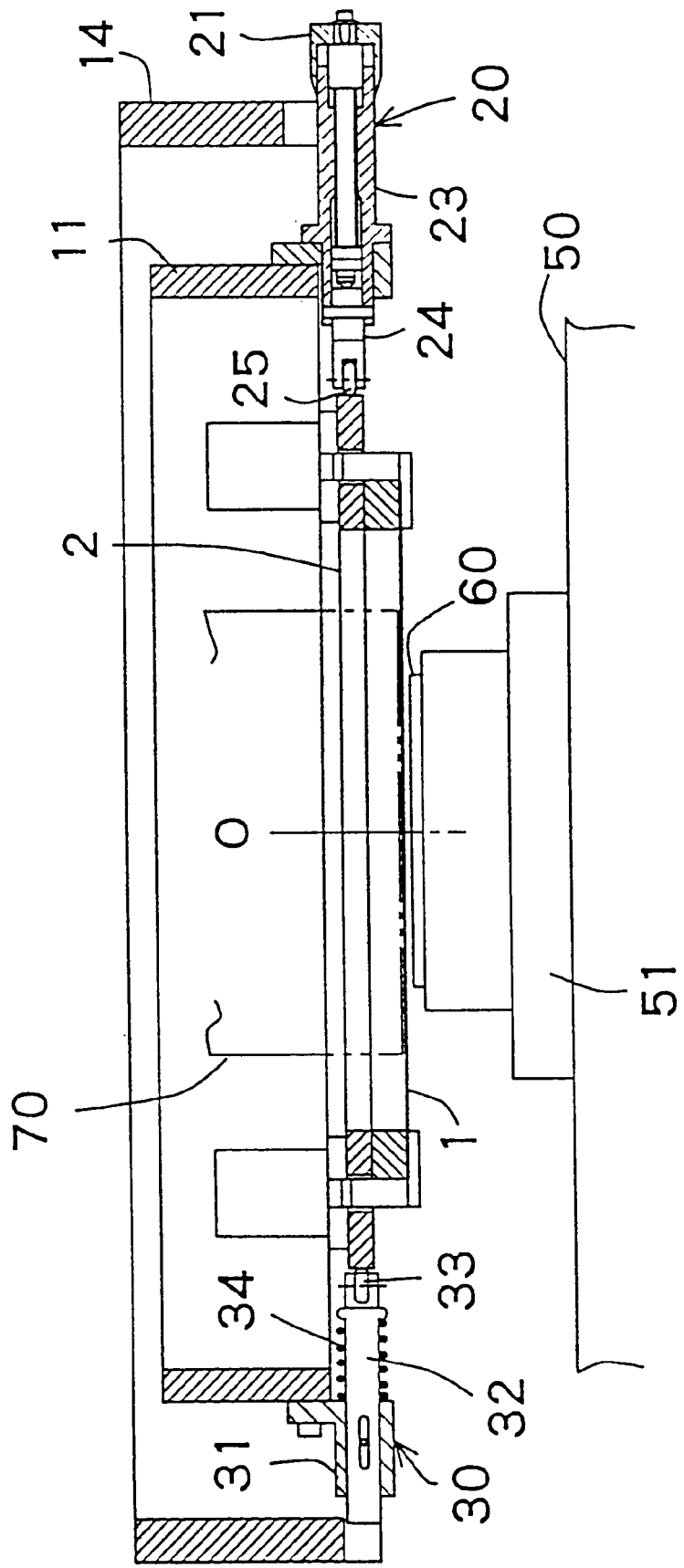

[FIG. 3]
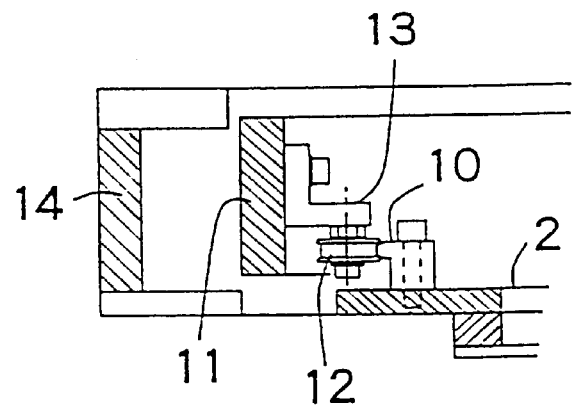
[FIG. 4]
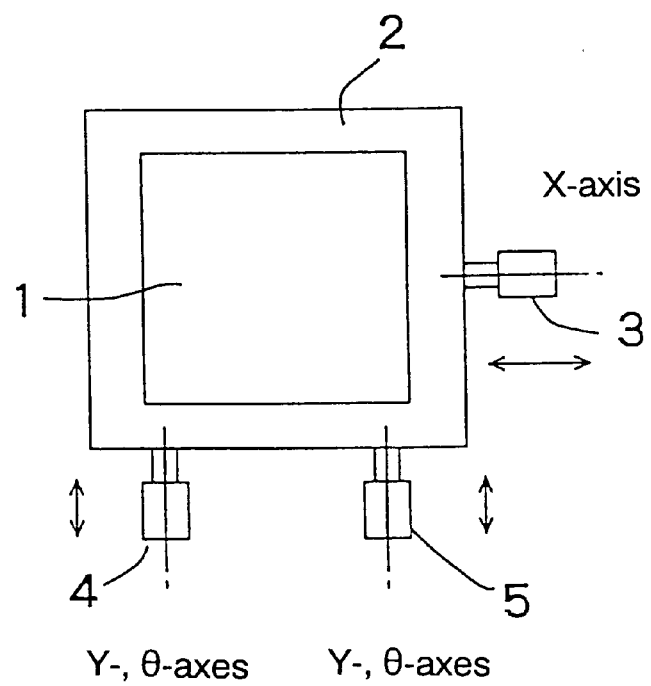

APPARATUS FOR SCREEN POSITION CORRECTING IN SCREEN PRINTING

FIELD OF THE INVENTION

The present invention relates to a method and apparatus for correcting the position of the screen in a screen printing machine for applying a screen print to a substrate for an electronic component or the like.

BACKGROUND OF THE INVENTION

In a conventional screen printing machine, correction of the position of a printing screen with respect to an article to be printed (hereinafter referred to as "printed article") such as a substrate for an electronic component or the like, is carried out by means of a mechanism for concurrently adjusting three axes. This mechanism thus corrects the position of the screen in a lateral direction (X-axis correction), it corrects the position thereof in a longitudinal direction perpendicular to the lateral direction (Y-axis correction), and it corrects the position thereof in a rotational direction (θ-axis correction). Such a conventional position adjusting mechanism is shown in FIG. 4 by way of example. More particularly, the mechanism includes a first adjustment member 3 arranged for laterally moving a screen frame 2 mounted thereon with a screen printing mask or printing screen 1 to carry out X-axis correction of the printing screen 1, as well as second and third adjustment members 4 and 5 arranged in juxtaposition to each other for moving the screen frame 2 in a longitudinal direction to carry out Y-axis correction of the printing screen 1. The second adjustment member 4 and third adjustment member 5 are also constructed so that the amount of correction by the members 4 and 5, respectively, are different from each other in order to concurrently carry out correction of the printing screen 1 in a θ-axis direction.

Thus, the conventional position adjusting mechanism shown in FIG. 4 is adapted to concurrently adjust the three X-, Y- and θ-axes, so that adjustment of each of these axes leads to a variation in correction of the remaining axes. For example, changes in the amounts of correction of the second and third adjustment members 4 and 5 for the θ-axis correction will require a variation in the amount of Y-axis correction, as well as the x-axis correction. This fails to facilitate printing position correcting, resulting in the operation being troublesome and time consuming.

The present invention is an attempt to overcome the foregoing disadvantages of the prior art. Accordingly, it is an object of the present invention to provide a method and an apparatus for correcting a screen position during screen printing, which are capable of accomplishing correction of a printing position in a short period of time by independently carrying out correction of a position of a screen frame in a rotational direction, or θ-axis correction of the screen frame, the screen frame having a printing screen mounted thereon.

This and other objects and the novel features of the present invention will be readily appreciated as the same becomes better understood by reference to the following detailed description of a preferred embodiment of the invention. cl SUMMARY OF THE INVENTION In accordance with the present invention, these and other objects have now been realized by the invention of a method for adjusting the position of a printing screen having a center of rotation mounted on a screen frame for use in a screen printing process comprising rotatably supporting the screen frame at a plurality of locations on a screen frame holder and rotating the screen frame around the center of rotation by means of an adjustment member associated with the screen frame holder in order to correct the position of the printing screen with respect to the center of rotation. In accordance with one embodiment of the method of the present invention, the method includes fixing the screen frame to the screen frame holder after correcting the position of the printing screen.

In accordance with another embodiment of the method of the present invention, the screen frame has x and y axes, and the method includes further correcting the position of the printing screen by altering the position of the screen frame along the x and y axes.

In accordance with another embodiment of the method of the present invention, adjusting of the position of the printing screen is carried out with respect to an article to be screen printed, the article being mounted on a table having x and y axes, and the method including further correcting the position of the printing screen by altering the position of the table along the x and y axes.

In accordance with another embodiment of the method of the present invention, rotating of the screen frame includes elastically biasing the screen frame against the rotating to control the rotating step.

In accordance with the apparatus of the present invention, apparatus has been discovered for adjusting the position of a printing screen having a center of rotation for use in a screen printing process comprising a screen frame with the printing screen mounted thereon, a screen frame holder, a plurality of first arcuate guide members mounted on the screen frame and defining an arc having a predetermined circumference defined by a predetermined radius, a plurality of second guide members mounted on the screen frame holder, the plurality of second guide members corresponding to the plurality of first arcuate guide members, whereby the plurality of second guide members movably supports the plurality of first arcuate guide members, and an adjustment member adapted to urge the screen frame around the center of rotation of the printing screen. Preferably, the plurality of second guide members comprises a plurality of guide rollers.

In accordance with one embodiment of the apparatus of the present invention, the apparatus includes fixing means for fixing the position of the screen frame with respect to the screen frame holder.

In accordance with another embodiment of the apparatus of the present invention, the apparatus includes a screen frame biasing member for biasing the screen frame in a direction towards the adjustment member.

In accordance with another embodiment of the apparatus of the present invention, the adjustment member comprises a first support member mounted on the screen frame holder, an adjustment screw threadably inserted into the first support member, a first slide member slidable with respect to the first support member and engaged with the adjustment screw, and an abutment member mounted on the slide member for abutment against the screen frame. In a preferred embodiment, the abutment member comprises an abutment roller.

In accordance with another embodiment of the apparatus of the present invention, the screen frame biasing member comprises a second support member mounted on the screen frame holder, a second slide member slidable with respect to the second support member, a receiving member mounted on the second slide member and in contact with the screen frame, and a spring for biasing the second slide member towards the screen frame, whereby the receiving member is maintained in contact with the screen frame. In a preferred embodiment, the receiving member comprises a receiving roller rotatably mounted on the second slide member.

In accordance with one embodiment of the present invention, a method for correcting the screen position in screen printing processes is provided. The method of the present invention includes the steps of rotatably supporting a screen frame, which has a printing screen mounted thereon, at a plurality of locations on a screen frame holder; and urging the screen frame in a direction which deviates from a center of rotation of the screen frame by means of an adjustment mechanism mounted on the screen frame holder, to thereby rotate the screen frame, resulting in correcting a position of the screen in a direction of rotation thereof.

In accordance with another aspect of the present invention, an apparatus for screen position correcting in screen printing is provided. The apparatus of the present invention includes a screen frame having a printing screen mounted thereon; a plurality of arcuate guide members each fixedly mounted on the screen frame in a manner to define an arc of an identical circumference having a predetermined radius; a screen frame holder; guide roller mounted on the screen frame holder so as to correspond to the respective arcuate guide members and arranged so as to movably support the respective arcuate guide members thereon; an adjustment mechanism arranged on the screen frame holder so as to force the screen frame in a direction which deviates from a center of rotation of the screen frame; and fixing means for fixing the screen frame at a predetermined position with respect to the screen frame holder.

BRIEF DESCRIPTION OF THE DRAWINGS

The present invention may be more fully appreciated with reference to the following detailed description, which, in turn, refers to the drawings in which:

FIG. 1 is a top, plan view of one embodiment of the apparatus for correcting the screen position in screen printing according to the present invention;

FIG. 2 is a side, elevational, partially sectional view of the apparatus shown in FIG. 1;

FIG. 3 is a side, elevational, fragmentary, partially sectional view of a portion of the apparatus shown in FIG. 1; and FIG. 4 is a top, schematic representation of apparatus of the prior art for correcting printing positions.

DETAILED DESCRIPTION

Referring to FIGS. 1 to 3, an embodiment of an apparatus according to the present invention is illustrated. The apparatus of the illustrated embodiment includes a screen printing mask or printing screen 1 for printing a printing paste, such as a conductive paste, a cream solder or the like, on a printed article, such as a substrate for an electronic component or the like. The printing screen 1 is mounted on a screen frame 2 formed with a substantially square or rectangular shape. The screen frame 2 is fixedly mounted on each of portions of an upper surface thereof, adjacent to its four corners with a guide member 10 of an arcuate shape. The apparatus also includes a screen frame holder 11 arranged so as to surround the screen frame 2. The screen frame holder 11 is rotatably mounted thereon with guide rollers 12 through respective mounting brackets 13. The guide rollers 12 are each arranged so as to be slidably engaged with a corresponding one of the arcuate guide members 10 in order to be movably supported thereon. A plurality of arcuate guide members 10 are each fixedly mounted on the screen frame 2 in such a manner that an outer peripheral edge thereof defines an arc of an identical circumference having a certain radius about a center 0 of rotation of the screen frame 2. Thus, the guide rollers 12 are arranged in correspondence to the respective arcuate guide members 10, so that the screen frame 2 may be rotatably supported on the screen frame holder 11. The apparatus further includes an outer frame 14 arranged outside the screen frame holder 11. The screen frame holder 11 is fixedly connected at its corners to the outer frame 14.

Furthermore, the apparatus includes an adjustment mechanism 20 arranged on one side of the screen frame holder 11 for correction of a position of the screen frame 2 in a rotational direction thereof, or for θ-axis correction of the screen frame 2. The adjustment mechanism 20 includes an θ-axis adjusting screw 21 as a major part thereof and a dial gauge 22 arranged in proximity to the θ-axis adjusting screw 21 for indicating the relationship between a rotational position of the θ-axis adjusting screw 21 and the amount of θ-axis correction. The adjustment mechanism 20 is constructed such that rotation of the θ-axis adjusting screw 21 permits the θ-axis adjusting screw 21 to force one side of the screen frame 2 in a direction which deviates from the center O of rotation of the screen frame 2 or toward a position eccentric to the center O of rotation, to thereby rotate or pivotally move the screen frame 2. Moreover, the apparatus includes a screen frame receiving mechanism 30 mounted on a side of the screen frame holder 11 opposite to the above-described side thereof on which the adjustment mechanism 20 is arranged so as to receive a side of the screen frame 2 opposite to the above-described side thereof while elastically biasing the opposite side of the screen frame 2.

The adjustment mechanism 20, as shown in FIG. 2, includes a cylindrical support 23 fixed on the screen frame holder 11, the θ-axis adjusting screw 21 threadedly engaged with a female thread formed on an inner periphery of the support 23, a pressing slide member 24 forced by a distal end of the θ-axis adjusting screw 21, to thus be slid in the cylindrical support 23 without rotation, and an abutment roller 25 rotatably supported on a distal end of the slide member 24. Thus, rotation of the θ-axis adjusting screw 21 leads to displacement or shifting of the distal end of the θ-axis adjusting screw 21, resulting in the slide member 24 being moved in the cylindrical support 23, so that the abutment roller 25 forces a side surface of the screen frame 2 in a predetermined amount, to thereby permit the screen frame 2 to be pivotally moved by a desired amount.

The screen frame receiving mechanism 30 functions to elastically bias the screen frame 2 toward the adjustment mechanism 20 in order to maintain a gap or space from being formed between the abutment roller 25 of the adjustment mechanism 20 and the screen frame 2. For this purpose, the screen frame receiving mechanism 30 includes a cylindrical support 31 fixed on the screen frame holder 11, a receiving-side slide member 32 arranged so as to slide in the cylindrical support 31, a receiving roller 33 rotatably supported on a distal end of the receiving slide member 32, and a compression spring 34 arranged so as to elastically bias the slide member 32 in a direction in which the slide member 32 is projected. In the screen frame receiving mechanism 30 thus constructed, the receiving-side slide member 32 retreats and advances with the advance and retreat of the θ-axis adjusting screw 21 of the adjustment mechanism 20 arranged opposite to the screen frame receiving mechanism 30 through the screen frame 20 interposed therebetween, so that a position of the screen frame 2 in a rotational direction thereof may be smoothly adjusted.

The screen frame holder 11 is mounted thereon through brackets 41 with screen frame fixing screws 40 which act as a screen frame fixing means for fixing the screen frame 2 after completion of the printing position adjustment.

The printed article 60, as shown in FIG. 2, is positioned on a table 51 arranged on a base 50 of a screen printing machine. The table 51 may be an X-Y table, when positional adjustment of the printed article 60 in X- and Y-directions is required. The screen frame holder 11 and outer frame 14 are supported on a body frame mounted on the base 50 so as to upwardly extend therefrom. The screen frame holder 11 and outer frame 14 are arranged on the body frame in a manner so as to be vertically movable or in a manner to be positionally adjustable in the X- and Y-directions and vertically movable. Furthermore, a squeegee mechanism 70 is arranged above the printing screen 1 supported on the screen frame 2 so as to apply a printing paste on the printing screen 1 to the printed article 60 by printing. As the squeegee mechanism 70 may be constructed in a manner which is widely employed in a conventional screen printing machine, a detailed explanation thereof is omitted herein.

In the illustrated embodiment thus constructed, positional correction of the printing screen 1 in a rotational direction thereof, or θ-axis correction of the printing screen 1, may be carried out by rotating the θ-axis adjusting screw 21 of the adjustment mechanism 20 by a predetermined amount while observing the dial gauge 22. The slide member 32 of the screen frame receiving mechanism 30 retreats or advances with the advance or retreat of the θ-axis adjusting screw 21 of the adjustment mechanism 20 opposite to the screen frame receiving mechanism 30 with the screen frame 2 being interposed therebetween, so that the screen frame 2 may be rotated or pivotally moved by a predetermined angle about the center O of rotation thereof. The screen frame fixing screws 40 are thus tightened in order to fix the screen frame 2 to the screen frame holder 11. Positional correction of the printing screen 1 in a lateral direction thereof, or X-axis correction, and that in a longitudinal direction thereof, perpendicular to the lateral direction, or Y-axis correction thereof, may be carried out either by moving the whole screen frame holder 11 in the X- and Y-directions with respect to the body frame or by carrying out X-Y positional correction using an X-Y table, such as table 51 having the printed article 60 placed thereon.

It can thus be seen that the illustrated embodiment permits positional correction of the printing screen 1 in the rotational direction thereof, or θ-axis correction, to be independently carried out, so that the positional correction may be rapidly accomplished in a short period of time without altering the center of the printing screen 1.

In the illustrated embodiment, the θ-axis adjusting screw 21 of the adjustment mechanism 20 is manually operated or rotated. Alternatively, operation of the θ-axis adjusting screw 21 may be automatically attained by rotating or driving it by means of a motor.

While a preferred embodiment of the present invention has been described, it is to be understood that the invention is not limited to the specific embodiment thereof and that obvious modifications and variations are possible in light of the above teachings. It is therefore to be understood that within the scope of the appended claims, the invention may be practiced otherwise than as specifically described.

As can be seen from the foregoing, the present invention is constructed such that the screen frame having the printing screen mounted thereon is rotatably supported on the screen frame holder through a plurality of locations and the screen frame is forced in the direction which deviates from the center of rotation thereof through the adjustment mechanism arranged on the screen frame holder. Such construction permits positional correction of the screen in the rotational direction thereof to be independently attained. This results in adjustment of a printing position being rapidly accomplished in a short period of time without varying the center of the printing screen.

What is claimed is:

1. Apparatus for adjusting the position of a printing screen having a center of rotation for use in a screen printing process comprising a screen frame with said printing screen mounted thereon, a screen frame holder, a plurality of first arcuate guide members mounted on said screen frame and defining an arc having a predetermined circumference defined by a predetermined radius, a plurality of second guide members mounted on said screen frame holder, said plurality of second guide members corresponding to said plurality of first arcuate guide members, whereby said plurality of second guide members movably supports said plurality of first arcuate guide members, and an adjustment member adapted to urge said screen frame around said center of rotation of said printing screen.

2. The apparatus of claim 1 wherein said plurality of second guide members comprises a plurality of guide rollers.

3. The apparatus of claim 1 including fixing means for fixing the position of said screen frame with respect to said screen frame holder.

4. The apparatus of claim 1 including a screen frame biasing member for biasing said screen frame in a direction towards said adjustment member.

5. The apparatus of claim 4 wherein said screen frame biasing member comprises a second support member mounted on said screen frame holder, a second slide member slidable with respect to said second support member, a receiving member mounted on said second slide member and in contact with said screen frame, and a spring for biasing said second slide member towards said screen frame, whereby said receiving member is maintained in contact with said screen frame.

6. The apparatus of claim 5 wherein said receiving member comprises a receiving roller rotatably mounted on said second slide member.

7. The apparatus of claim 1 wherein said adjustment member comprises a first support member mounted on said screen frame holder, an adjustment screw threadably inserted into said first support member, a first slide member slidable with respect to said first support member and engaged with said adjustment screw, and an abutment member mounted on said slide member for abutment against said screen frame.

8. The apparatus of claim 7 wherein said abutment member comprises an abutment roller.

* * * * *